US008617642B2

United States Patent
Joo et al.

(10) Patent No.: US 8,617,642 B2
(45) Date of Patent: Dec. 31, 2013

(54) PREPARATION OF THIN FILM FOR SOLAR CELL USING PASTE

(75) Inventors: Oh-shim Joo, Seoul (KR); Byoung Koun Min, Seoul (KR); Kwang Deog Jung, Seoul (KR); Jun-haeng Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 1037 days.

(21) Appl. No.: 12/261,566

(22) Filed: Oct. 30, 2008

(65) Prior Publication Data

US 2009/0214763 A1 Aug. 27, 2009

(30) Foreign Application Priority Data

Feb. 27, 2008 (KR) .................. 10-2008-0017727

(51) Int. Cl.
*B05D 5/12* (2006.01)

(52) U.S. Cl.
USPC ............. 427/76; 427/216; 427/217; 136/262; 136/264; 136/265; 438/95

(58) Field of Classification Search
None
See application file for complete search history.

(56) References Cited

U.S. PATENT DOCUMENTS

| | | | | |
|---|---|---|---|---|
| 4,192,721 A | * | 3/1980 | Fawcett et al. | 205/229 |
| 4,536,607 A | * | 8/1985 | Wiesmann | 136/249 |
| 6,268,014 B1 | * | 7/2001 | Eberspacher et al. | 427/74 |
| 6,821,559 B2 | * | 11/2004 | Eberspacher et al. | 427/226 |
| 7,227,066 B1 | * | 6/2007 | Roscheisen et al. | 257/40 |
| 7,306,823 B2 | * | 12/2007 | Sager et al. | 427/217 |
| 7,663,057 B2 | * | 2/2010 | Yu et al. | 136/264 |
| 2005/0183767 A1 | * | 8/2005 | Yu et al. | 136/263 |
| 2006/0062902 A1 | * | 3/2006 | Sager et al. | 427/74 |
| 2007/0092648 A1 | * | 4/2007 | Duren et al. | 427/255.31 |
| 2007/0163637 A1 | * | 7/2007 | Robinson et al. | 136/262 |
| 2007/0169811 A1 | * | 7/2007 | Van Duren et al. | 136/262 |
| 2007/0169812 A1 | * | 7/2007 | Robinson et al. | 136/262 |
| 2007/0169813 A1 | * | 7/2007 | Robinson et al. | 136/262 |
| 2007/0178620 A1 | * | 8/2007 | Basol | 438/94 |

* cited by examiner

*Primary Examiner* — Mark A Osele
*Assistant Examiner* — Nickolas Harm
(74) *Attorney, Agent, or Firm* — Ladas & Parry LLP

(57) ABSTRACT

A preparation method of a CIS-based or CIGS-based thin film for a light absorption layer of a solar cell, which uses a paste prepared by mixing precursors of Cu, In, Se, and optional Ga in a solvent, minimizes the raw material loss, does not produce a toxic gas during the process, and is suitable for producing a large scale film at a low production cost.

18 Claims, 6 Drawing Sheets

PREPARATION OF THIN FILM FOR SOLAR CELL USING PASTE

CROSS REFERENCE TO RELATED APPLICATIONS

This application claims priority from Korean patent application No. 10-2008-0017727 filed on Feb. 27, 2008, all of which is incorporated herein by reference in its entireties for all purposes.

FIELD OF THE INVENTION

The present invention relates to a method for preparing a CIS (Copper-Indium-Selenide)-based or CIGS (Copper-Indium-Gallium-Selenide)-based thin film for a light absorption layer of a solar cell.

BACKGROUND OF THE INVENTION

Various inorganic or organic semiconductors have been used for manufacturing a solar cell, but only a silicon-based solar cell and a CIS-based or CIGS-based thin film (hereinafter referred to as "CI(G)S-based thin film") solar cell have been commercialized.

Although a silicon-based solar cell has high photoconversion efficiency, its manufacturing cost is high. For this reason, there have been many attempts to manufacture a thin film solar cell using a compound semiconductor which can be shaped into a thin form.

Generally, such a thin film solar cell comprising a compound semiconductor is produced using elements of groups 11, 13 and 16 which typically involve the use of a CI(G)S thin film as the light absorption layer. In such a thin film solar cell, the light absorption layer, the buffer layer and the window layer are made of $CuIn(Ga)Se_2$, CdS and n-type semiconductor, respectively. In particular, the light absorption layer of a solar cell determines the solar cell's capacity.

A CI(G)S light absorption layer is generally made by co-evaporation of appropriate metals under a gaseous Se atmosphere, or by selenization of a Cu—Ga—In alloy layer preformed using a evaporation deposition method using a gaseous selenium compound. A solar cell comprising a CI(G)S light absorption layer manufactured by the above methods shows a high photoconversion efficiency. However, these methods are not suitable for making a large scale thin layer and hampered by the problem of air pollution resulting from the use of toxic gaseous selenium or its compound, besides the additional problem of raw material loss caused by the use of vacuum equipments, which raises the manufacturing cost.

Low-cost manufacture processes of a thin film which do not required the use of vacuum equipments such as a chemical spray pyrolysis method and a paste coating process using metal precursors have been reported [U.S. Pat. No. 6,127,202 in the name of Kapur et al.; and U.S. Pat. No. 5,910,336 in the name of Ishihara et al.] However, these methods still suffer from the problem in that they use toxic $H_2Se$ or gaseous Se in the selenization step.

Thus, there exists a need to develop a low cost method of manufacturing a compound semiconductor for a large-scale film. For such a method, it is desirable to prepare the light absorption layer using a paste or an ink comprising a CI(G)S material.

SUMMARY OF THE INVENTION

Accordingly, it is an object of the present invention to provide a low-cost method for preparing a thin film for a light absorption layer of a solar cell, using a CI(G)S paste or ink without the use of toxic gaseous selenium or $H_2Se$.

In accordance with the present invention, there is provided a method for preparing a CI(G)S-based thin film, comprising the steps of:

(1) mixing precursors of Cu and In, optionally with a precursor of Ga to obtain a mixture, and optionally heating the mixture to obtain an oxide mixture;

(2) adding a Se precursor to the mixture or the oxide mixture and adding the resulting mixture to an aqueous or alcohol solvent to obtain a paste; and (3) coating the paste on a substrate and heating the coated substrate under an inert or reducing gas atmosphere.

The present invention also provides a CI(G)S-based thin film prepared thereby.

The method of present invention using a paste does not require the use of vacuum equipments and minimizes the raw material loss, and therefore, the manufacture cost is low. Furthermore, the method of the present invention does not employ toxic $H_2Se$ gas or gaseous Se so as to make the manufacturing process safe. Besides, the method is applicable to various types of substrates, and it is easy to control the voltage and the current of the resulting solar cell through controlling the energy band gap by adjusting the composition of the raw material.

BRIEF DESCRIPTION OF THE DRAWINGS

The above and other objects and features of the present invention will become apparent from the following description of the invention, when taken in conjunction with the accompanying drawings, which respectively show.

DETAILED DESCRIPTION OF THE INVENTION

Hereinafter, CI(G) refers to Copper-Indium or Copper-Indium-Gallium, and CI(G)S refers to Copper-Indium-Selenide or Copper-Indium-Gallium-Selenide.

Figure 1:
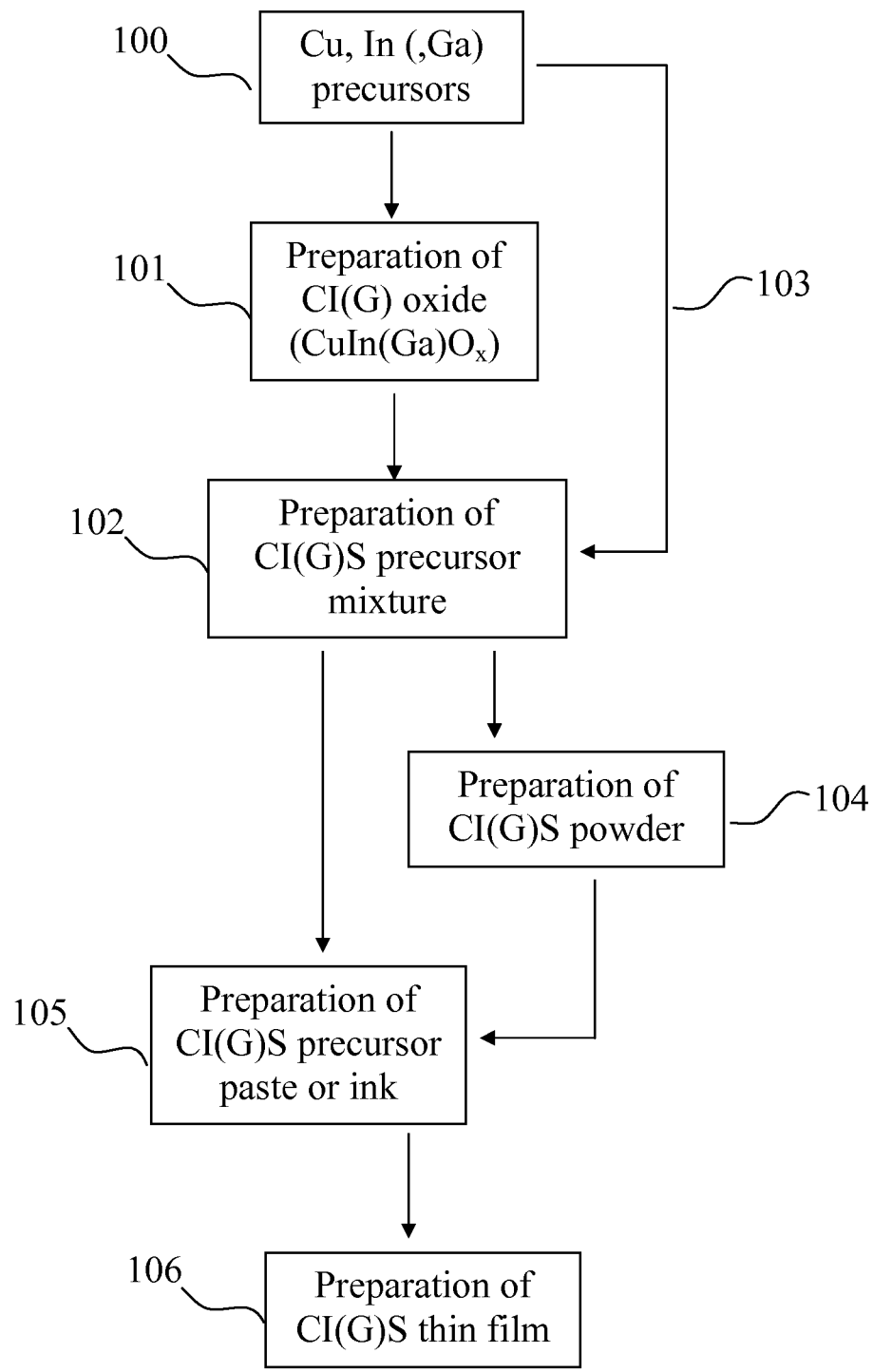
FIG. 1: an example of the method for preparing the CI(G)S-based thin film of the present invention.
Figure 2:
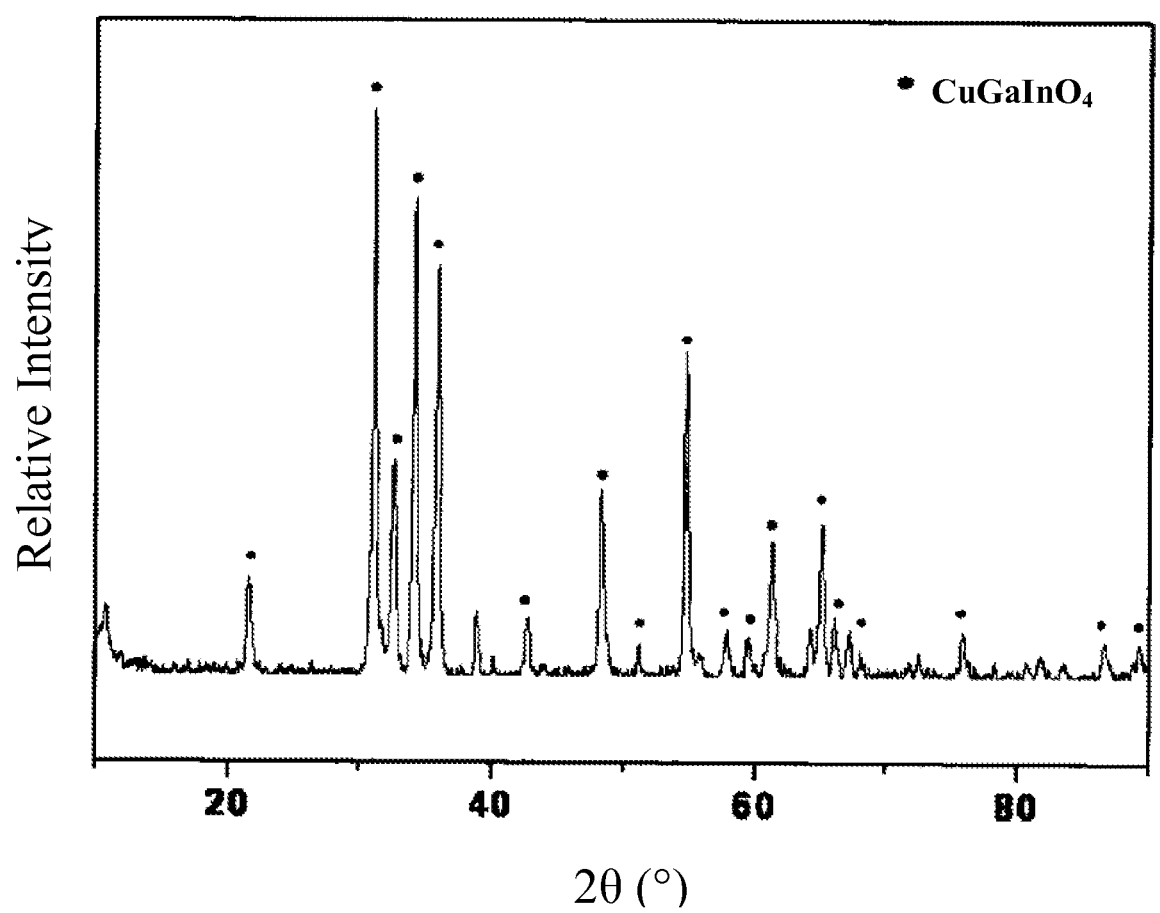
FIG. 2: an XRD pattern of the CIGS oxide ($CuInGaO_4$) prepared in Example 1.
Figure 3:
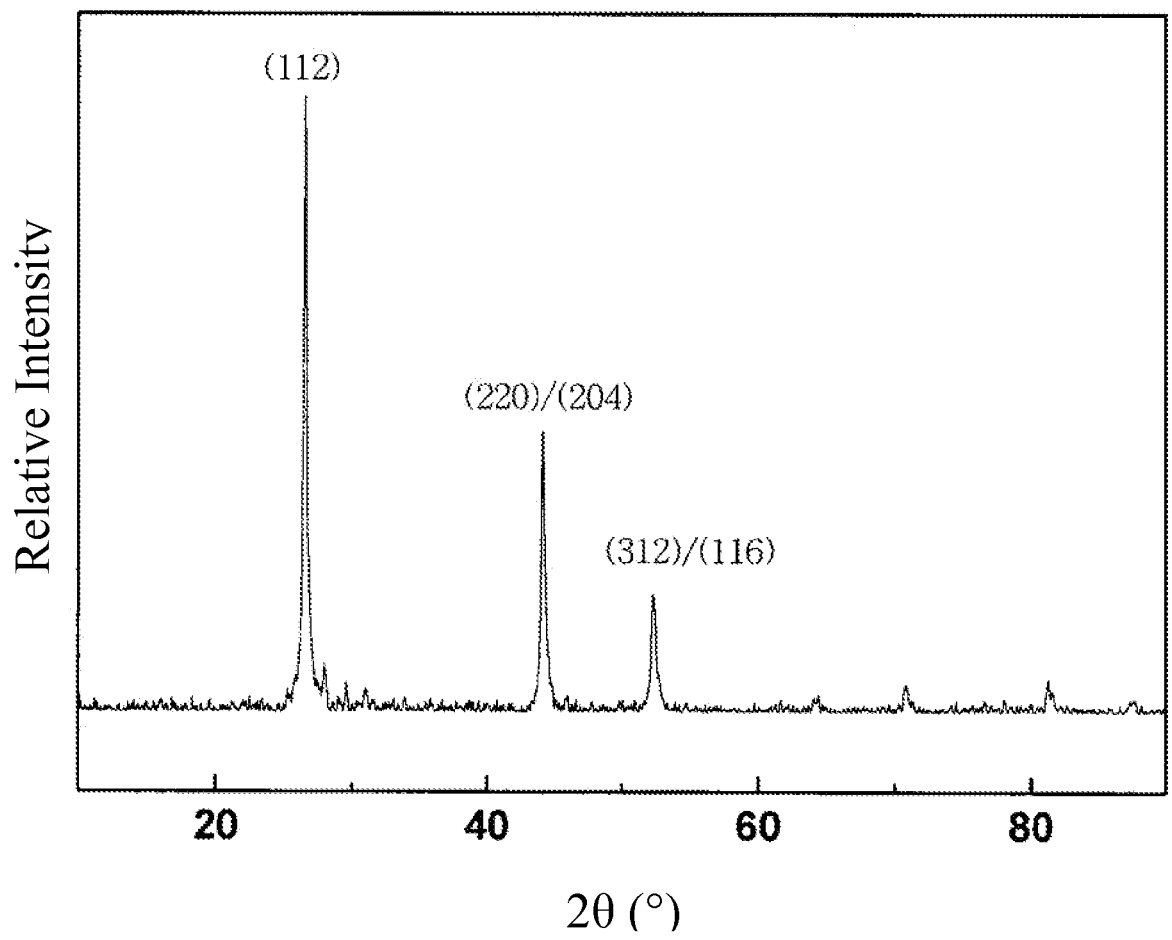
FIG. 3: an XRD pattern of the CIGS-based thin film prepared in Example 1.
Figure 4:
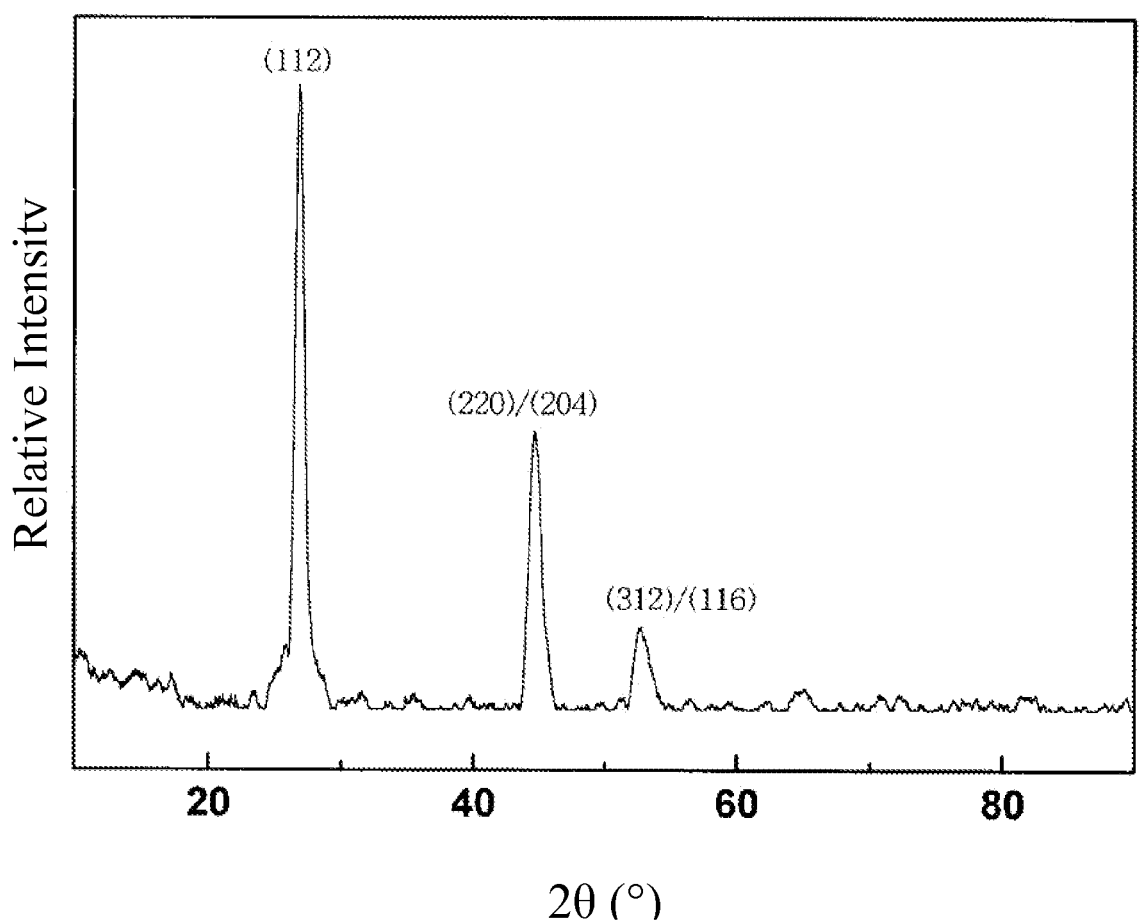
FIG. 4: an XRD pattern of the CIGS-based thin film prepared in Example 2.
Figure 5:
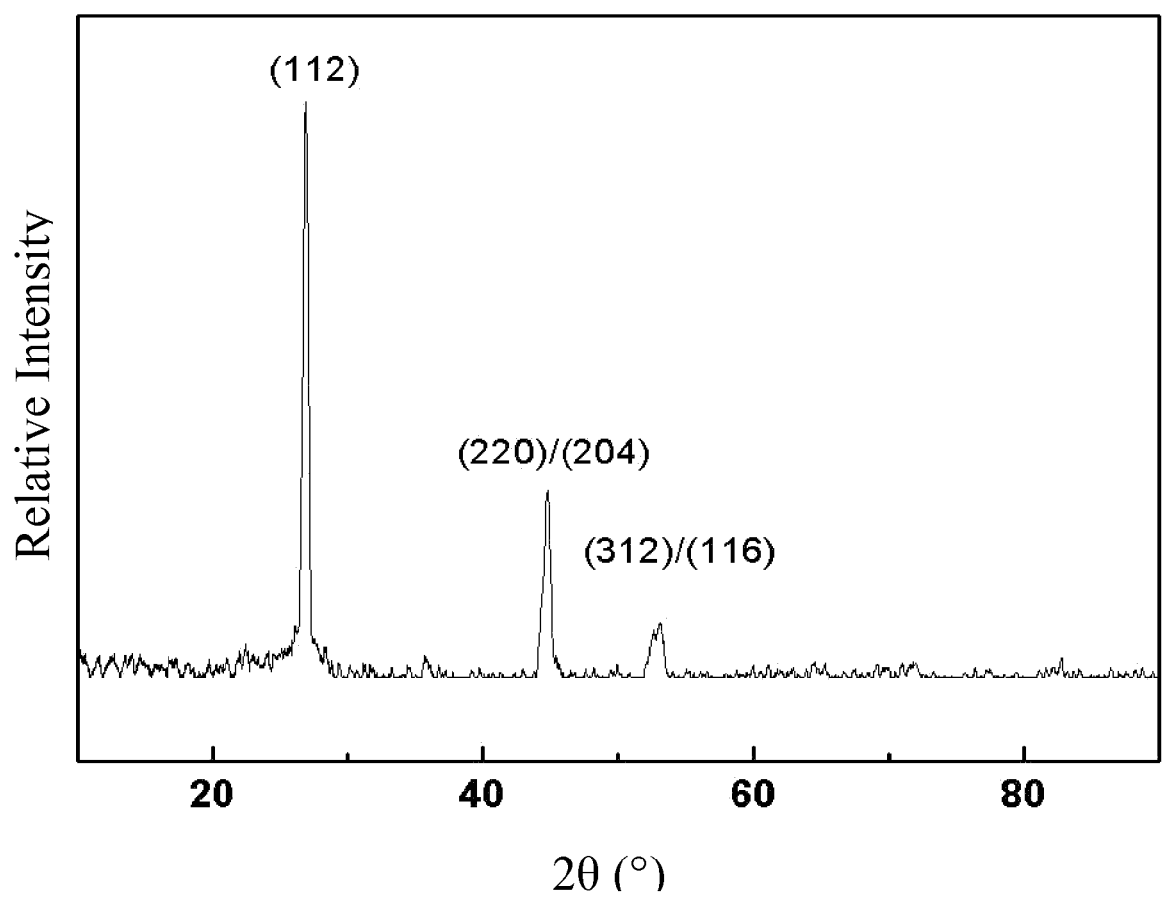
FIG. 5: an XRD pattern of the CIGS-based thin film prepared in Example 3.
Figure 6:
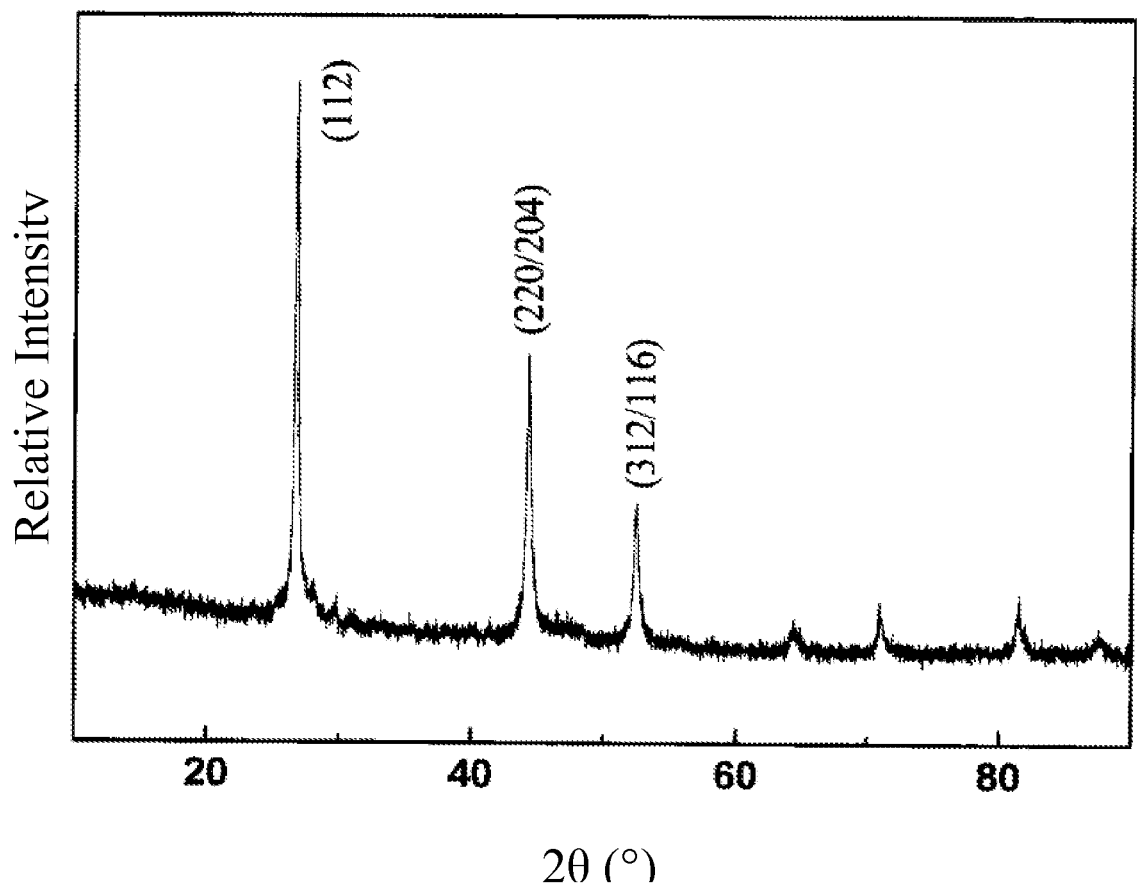
FIG. 6: an XRD pattern of the CIGS-based powder prepared in Example 4.

The inventive method for preparing a CI(G)S-based thin film using a paste or ink will be explained with reference to FIG. 1.

In the first step of the method according to the present invention, precursors of Cu, In, and optional Ga are mixed to prepare a CI(G) precursor mixture (100), and optionally the mixture is heated to obtain a CI(G) oxide mixture (101). The mole ratio of the precursors of Cu, In and Ga used in this step is 1:0.5:0 to 1:2:2, preferably 1:0.8:0.8 to 1:1.2:1.2.

The precursors of the Cu, In and Ga may each be the corresponding hydroxide, nitrate, sulphate, acetate, chloride, acetylacetonate, formate, or oxide. The metal precursors are preferably mixed in the form of dispersion in water or alcohol, at a pH of 10 or below, preferably 4 to 9.

The optional heat treatment of the precursor mixture can be conducted at a temperature of 500 to 900° C., preferably 650 to 800° C., after drying the mixture at room temperature.

In the second step of the method according to the present invention, the CI(G) precursor mixture or oxide mixture prepared in the first step is mixed with a Se precursor to obtain a CI(G)S precursor mixture (102, 103), which is added to an aqueous, alcohol, carbonate or glycol solvent, and stirred to prepare a CI(G)S paste or ink (105). The mole ratio of the CI(G) precursor mixture or oxide mixture and the Se precursor used in this step is 1:0.5 to 1:2.

The Se precursor may be $SeCl_4$, $SeS_2$, $Na_2Se$, $Na_2SeO_3$, $Na_2SeO_3 \cdot 5H_2O$ or a mixture thereof.

The CI(G)S paste or ink may further comprise a dispersing agent and/or a binder added during the stage of mixing. Any conventional dispersing agent such as α-terpienol, ethylene glycol, thioacetamide or a mixture thereof, and/or binder such as ethyl cellulose, palmitic acid, polyethylene glycol, polypropylene glycol, polypropylene carbonate or a mixture thereof can be used in this step in an amount of 10 to 400 parts by weight based on 100 parts by weight of the CI(G)S precursor mixture.

In order to enhance the electric property, sulfur may be added in the form of a sulfur-containing organic/inorganic compound, for example, by treating the thin film with gaseous $H_2S$ or adding a sulfur compound such as RSH (wherein R is alkyl or carboxyalkyl), thioacetamide or $Na_2S$ to the paste or the ink. The amount can range from 1 to 100 parts by weight based on 100 parts by weight of the CI(G)S precursor mixture.

Also to enhance the electric property of the solar cell comprising the thin film of the present invention, a dopant such as Na, K, Ni, P, As, Sb, Bi or a mixture thereof may be further added to the precursor mixture. For example, a precursor compound of such metal may be added during the stage of preparation of the paste or the ink in an amount of 0.01 to 10 parts by weight based on 100 parts by weight of the CI(G)S precursor mixture.

The CI(G)S precursor mixture prepared by the process 102 or 103 may be heated in order to obtain a CI(G)S powder (104). The heat treatment is preferably conducted under a reducing atmosphere at a temperature of 200 to 700° C., preferably 350 to 550° C. The CI(G)S powder of the present invention may be dispersed in a solvent, with an optional dispersing agent and/or binder to prepare a CI(G)S paste.

In the third step of the method according to the present invention, the paste or the ink prepared in the above step is coated on a substrate, and the coating is heat-treated to obtain a CI(G)S-based thin film (106). The substrate can be any material which is conductive and stable at a temperature of 300° C. or higher, e.g., ITO (Indium Tin Oxide) or FTO (Fluorine-doped Tin Oxide) glass, metal foil, metal plate or conductive polymer material.

The coating process of the paste or the ink may be conducted in a conventional manner, e.g., by using a method of doctor blade coating, screen coating, spin coating, spray coating or paint coating. The thickness of the coating layer may be in the range of 0.5 to 10 μm.

The heat treatment of the paste or the ink coating may be conducted under an inert gas and/or reducing gas atmosphere, preferably $H_2$/Ar mixed gas, at a temperature of 200 to 700° C., preferably 350 to 550° C.

The heat treatment of the paste or the ink coating may be also conducted under ambient atmosphere at a temperature of 100 to 400° C. followed by the heat treatment under an inert gas and/or reducing gas atmosphere mentioned above. This pre-annealing treatment reduces the level of carbon deposition in/on the films without perturbing the stoichiometry of the CI(G)S thin films.

The CI(G)S thin film or powder prepared by the method of the present invention has a good crystallinity.

The preparation method of the present invention has merits in terms of raw materials utilization efficiency and applicability in making a large-scale film, as compared with the conventional method, besides the fact the process is economical and free of the risk of toxic gas generation.

Also, the method of the present invention is applicable to preparing a thin film using other elements of groups 11, 13 and 16.

The following examples are intended to illustrate the present invention, however these examples are not to be construed to limit the scope of the invention.

EXAMPLES

Example 1

Preparation of a CIGS Thin Film Using a CIG Oxide 7.77 g (0.032 mol) of $Cu(NO_3)_2 \cdot 3H_2O$, 10.23 g (0.034 mol) of $In(NO_3)_2 \cdot 3H_2O$ and 8.70 g (0.034 mol) of $Ga(NO_3)_2 \cdot 3H_2O$ were dissolved in 30 mL of water, the pH was adjusted for 7 using NaOH (1M), and stirred for a day. The precipitates were isolated by filtering, dried at 110° C. for a day, and then heated at 800° C. for 5 hours to obtain a CIG oxide ($CuInGaO_4$).

0.83 g (0.0027 mol) of the resulting CIG oxide and 1.17 g (0.0053 mol) of $SeCl_4$ were added to 50 mL of ethanol, and then stirred thoroughly to obtain a CIGS precursor mixture. 10 g of α-terpienol (a dispersing agent) and 0.75 g of ethyl cellulose (a binder) were dissolved in 20 mL of ethanol, mixed with the CIGS precursor mixture, and the resulting mixture was stirred, followed by evaporating the solvent at 40° C. to obtain a CIGS paste.

The CIGS paste was coated on a glass plate using a doctor blade method, and the resulting coat was heated at 400° C. for 40 minutes under a $H_2$/Ar (5:95) atmosphere to obtain a CIGS thin film.

Example 2

Preparation of a CIGS Thin Film Using a Precursor Mixture 0.5 g (0.002 mol) of $Cu(NO_3)_2 3H_2O$, 0.43 g (0.0014 mol) of $In(NO_3)_2 \cdot 3H_2O$ and 0.16 g (0.0006 mol) of $Ga(NO_3)_2 3H_2O$ were mixed in 60 mL of ethanol, 1.17 g (0.0053 mol) of $SeCl_4$ was added to the resulting mixture, and the whole mixture was stirred thoroughly to obtain a CIGS precursor mixture. 10 g of α-terpienol (a dispersing agent) and 0.75 g of ethyl cellulose (a binder) were dissolved in 20 mL of ethanol, mixed with the CIGS precursor mixture, and the resulting mixture was stirred, followed by evaporating the solvent at 40° C. to obtain a CIGS paste. The CIGS paste was coated on a glass plate using a doctor blade method, the coat was heated at 400° C. for 40 minutes under a $H_2$/Ar (5:95) atmosphere to obtain a CIGS thin film.

Example 3

Preparation of a CIGS Thin Film Including Heat Treatment Under Ambient Atmosphere The CIGS paste prepared by the procedure of Example 1 was coated on a glass plate using a doctor blade method, and the resulting coat was heated at 250° C. for 60 minutes under ambient atmosphere followed by heat treatment at 400° C. for 40 minutes under a $H_2/Ar$ (5:95) atmosphere, to obtain a CIGS thin film.

Example 4

Preparation of CIGS Powder 0.83 g (0.0027 mol) of the CIG oxide ($CuInGaO_4$) prepared by the procedure of Example 1 and 1.17 g (0.0053 mol) of $SeCl_4$ were mixed followed by heating the resulting mixture at 400° C. for 40 minutes under a $H_2/Ar$ (5:95) atmosphere to obtain a CIGS-based powder.

XRD (X-Ray Diffraction) analysis was conducted for each of the products obtained in Examples 1 to 4, using XRD-6000 (Shimadzu, Japan). The resulting XRD patterns of the CIG oxide of Example 1, the CIGS thin films of Examples 1 to 3, and the CIGS powder of Example 4, are shown in FIGS. 2 to 6, respectively. It can be seen from FIGS. 3 to 6 that the characteristic peaks (112) and (220)/(204) of CIGS are dominant, which proves that a CIGS thin film as well as a CIGS powder were obtained.

While the invention has been described with respect to the above specific embodiments, it should be recognized that various modifications and changes may be made to the invention by those skilled in the art which also fall within the scope of the invention as defined by the appended claims.

What is claimed is:

1. A method for preparing a CIS (Copper-Indium-Selenide)-based or CIGS (Copper-Indium-Gallium-Selenide)-based thin film for a light absorption layer of a solar cell, the method comprising:

mixing precursors of Cu and In, optionally with a precursor of Ga into a first solvent to form a precursor mixture, wherein the precursor mixture is adjusted to have a pH of 10 or below and the first solvent comprises water and/or alcohol;

isolating precipitates from the precursor mixture;

heating the precipitates to obtain an oxide mixture;

adding a Se precursor to the oxide mixture in a second solvent that comprises water and/or alcohol to obtain a paste; and coating the paste on a substrate to obtain a coated substrate and heating the coated substrate under an inert or reducing gas atmosphere.

2. The method of claim 1, wherein the precursor of the Cu, In or Ga is the corresponding hydroxide, nitrate, sulphate, acetate, chloride, acetylacetonate, formate, or oxide.

3. The method of claim 1, wherein the precursors of Cu, In and optional Ga are mixed in a mole ratio of 1:0.5:0 to 1:2:2, wherein the ratios correspond respectively to Cu, In, and Ga.

4. The method of claim 1, wherein the Se precursor is $SeCl_4$, $SeS_2$, $Na_2Se$, $Na_2SeO_3$, $Na_2SeO_3.5H_2O$, or a mixture thereof.

5. The method of claim 1, wherein the oxide mixture is mixed with the Se precursor in a mole ratio of 1:0.5 to 1:2 in step (2).

6. The method of claim 1, wherein the heating the precipitates to obtain the oxide mixture is conducted at a temperature of 500 to 900° C.

7. The method of claim 1, wherein the first solvent mixed with the precursors is adjusted to have a pH between 4 to 9.

8. The method of claim 1, wherein a dispersing agent, a binder, or a combination thereof is further added into the second solvent.

9. The method of claim 8, wherein the dispersing agent is a-terpienol, ethylene glycol, thioacetamide, or a mixture thereof.

10. The method of claim 8, wherein the binder is ethyl cellulose, palmitic acid, polyethylene glycol, polypropylene glycol, polypropylene carbonate, or a mixture thereof.

11. The method of claim 1, further comprising adding a sulfur-containing compound into the paste.

12. The method of claim 11, wherein the sulfur-containing compound is $H_2S$, RSH (wherein R is alkyl or carboxyalkyl), thioacetamide or $Na_2S$.

13. The method of claim 1, wherein one or more elements selected from the group consisting of Na, K, Ni, P, As, Sb, and Bi are further added into the second solvent as a dopant.

14. The method of claim 1, wherein coating is conducted by a method of doctor blade coating, screen coating, spin coating, spray coating or paint coating.

15. The method of claim 1, wherein the heating of the coated substrate is conducted at a temperature of 200 to 700° C.

16. The method of claim 1, wherein the reducing gas is gaseous hydrogen.

17. The method of claim 1, wherein the heating of the coated substrate is conducted under atmospheric pressure at a temperature of 100 to 400° C. followed by heating under an inert or reducing gas atmosphere.

18. The method of claim 1, wherein the thickness of the coating layer is in the range of 0.5 to 10 μm.

* * * * *